United States Patent
Sun et al.

(10) Patent No.: US 10,979,084 B2
(45) Date of Patent: Apr. 13, 2021

(54) METHOD AND APPARATUS FOR VECTOR BASED LDPC BASE MATRIX USAGE AND GENERATION

(71) Applicant: Nokia Technologies Oy, Espoo (FI)

(72) Inventors: Jingyuan Sun, Beijing (CN); Yi Zhang, Beijing (CN); Xiangnian Zeng, Hangzhou (CN); Wei Jiang, Hangzhou (CN); Dongyang Du, Hangzhou (CN); Keeth Saliya Jayasinghe, Piliyandala (LK)

(73) Assignee: Nokia Technologies Oy, Espoo (FI)

( * ) Notice: Subject to any disclaimer, the term of this patent is extended or adjusted under 35 U.S.C. 154(b) by 14 days.

(21) Appl. No.: 16/471,617

(22) PCT Filed: Jan. 6, 2017

(86) PCT No.: PCT/CN2017/070377
§ 371 (c)(1),
(2) Date: Jun. 20, 2019

(87) PCT Pub. No.: WO2018/126428
PCT Pub. Date: Jul. 12, 2018

(65) Prior Publication Data
US 2020/0244290 A1    Jul. 30, 2020

(51) Int. Cl.
*H03M 13/03* (2006.01)
*H03M 13/11* (2006.01)
*H03M 13/15* (2006.01)
*H03M 13/27* (2006.01)
*H03M 13/00* (2006.01)

(52) U.S. Cl.
CPC ....... *H03M 13/616* (2013.01); *H03M 13/036* (2013.01); *H03M 13/114* (2013.01);
(Continued)

(58) Field of Classification Search
None
See application file for complete search history.

(56) References Cited

U.S. PATENT DOCUMENTS

2007/0256001 A1* 11/2007 Suzuki .................. H04L 1/0009
714/774
2008/0270867 A1 10/2008 Chung et al.
(Continued)

FOREIGN PATENT DOCUMENTS

CN    101023587 A    8/2007
CN    102347774 A    2/2012
(Continued)

OTHER PUBLICATIONS

Samsung, "Design of LDPC Code for High Throughput" (May 2016), 3GPP TSG RAN WG1 #85, (Year: 2016).*
(Continued)

*Primary Examiner* — April Y Blair
*Assistant Examiner* — Matthew W Wahlin
(74) *Attorney, Agent, or Firm* — Harrington & Smith

(57) ABSTRACT

A base matrix is applied to an LDPC coder. The base matrix includes multiple parts, each including multiple of rows and columns, and containing integers, each representative of an identity matrix cyclically shifted in accordance with the integer or representative of an all-zero matrix. At least two of the multiple parts are configured such that their respective column-wise combinations of rows represents a same starting vector, cyclically shifted or interleaved, with zero or more but not all integers not indicative of the all-zero matrix of the same vector substituted by integers indicative of the all-zero matrix. The at least two of the multiple parts are not identical. The applied base matrix is used for one of encoding data using the LDPC coder or decoding data using the LDPC coder.

19 Claims, 12 Drawing Sheets

(52) U.S. Cl.
CPC ......... *H03M 13/116* (2013.01); *H03M 13/15* (2013.01); *H03M 13/2707* (2013.01)

(56) References Cited

U.S. PATENT DOCUMENTS

| | | |
|---|---|---|
| 2013/0254628 A1 | 9/2013 | Kim et al. |
| 2016/0021663 A1 | 1/2016 | Takahashi et al. |
| 2016/0164537 A1* | 6/2016 | Pisek ................ H03M 13/1154 714/755 |
| 2016/0294416 A1* | 10/2016 | Hsieh ................ H03M 13/1142 |

FOREIGN PATENT DOCUMENTS

| | | |
|---|---|---|
| EP | 1924001 A1 | 5/2008 |
| EP | 2525495 A1 | 11/2012 |
| EP | 2536030 A1 | 12/2012 |
| EP | 2566056 A1 | 3/2013 |
| EP | 2690790 A1 | 1/2014 |
| WO | 2018/027497 A1 | 2/2018 |

OTHER PUBLICATIONS

"IR HARQ Schemes for LDPC", 3GPP TSG-RAN WG1 #86, R1-167274, Agenda item: 8.1.4.1, Nokia, Aug. 22-26, 2016, 6 pages.

International Search Report and Written Opinion received for corresponding Patent Cooperation Treaty Application No. PCT/CN2017/070377, dated Sep. 30, 2017, 11 pages.

"Design of LDPC Code for High Throughput", 3GPP TSG RAN WG1 #85, R1-164813, Agenda item: 7.1.5.1, Samsung, May 23-27, 2016, 3 pages.

Tentative Rejection received for corresponding Taiwan Patent Application No. 106145384, dated Aug. 20, 2018, 3 pages of Tentative Rejection and no page of translation available.

Extended European Search Report received for corresponding European Patent Application No. 17890117.9, dated Jul. 16, 2020, 11 pages.

Chen et al., "A 6.72-Gb/s 8pJ/Bit/Iteration IEEE 802.15.3c LDPC Decoder Chip", International Symposium on Integrated Circuits, Dec. 12-14, 2011, pp. 7-12.

Chen et al., "A Macro-Layer Level Fully Parallel Layered LDPC Decoder SOC for IEEE 802.15.3c Application", Proceedings of 2011 International Symposium on VLSI Design, Automation and Test, Apr. 25-28, 2011, 4 pages.

Fujita et al., "An Algebraic Method for Constructing Efficiently Encodable Irregular LDPC Codes", Proceedings. International Symposium on Information Theory, Sep. 4-9, 2005, 5 pages.

Office action received for corresponding Chinese Patent Application No. 201780080542.6, dated Aug. 5, 2020, 7 pages of office action and 3 pages of translation available.

* cited by examiner

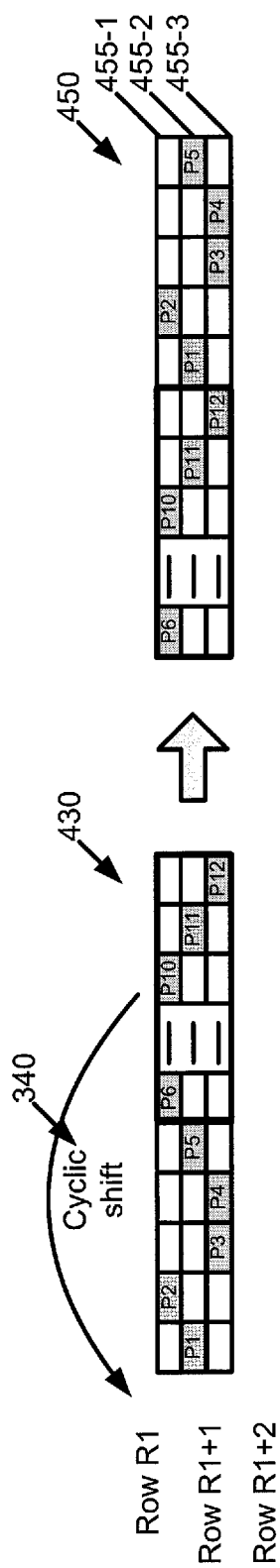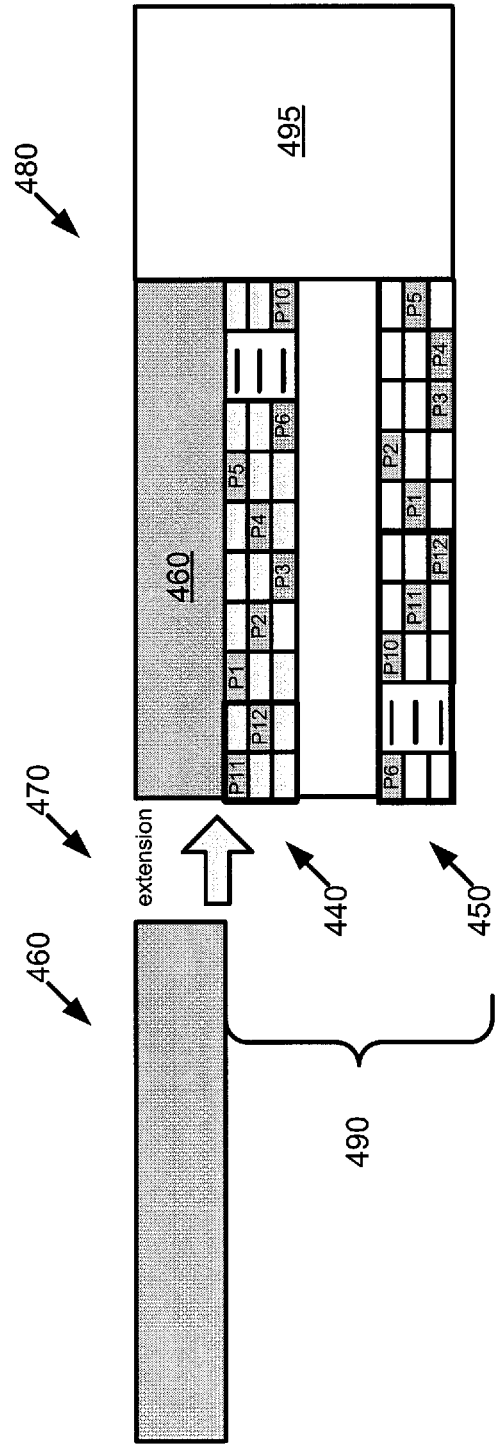
FIG. 4C
FIG. 4D

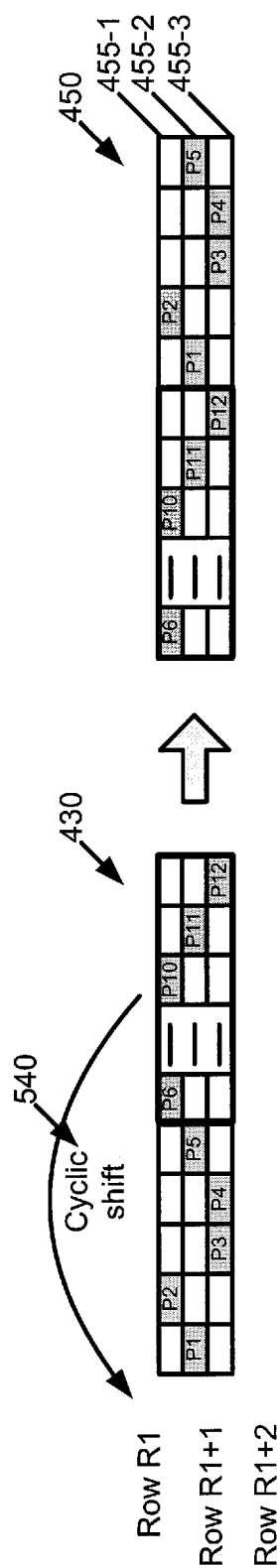
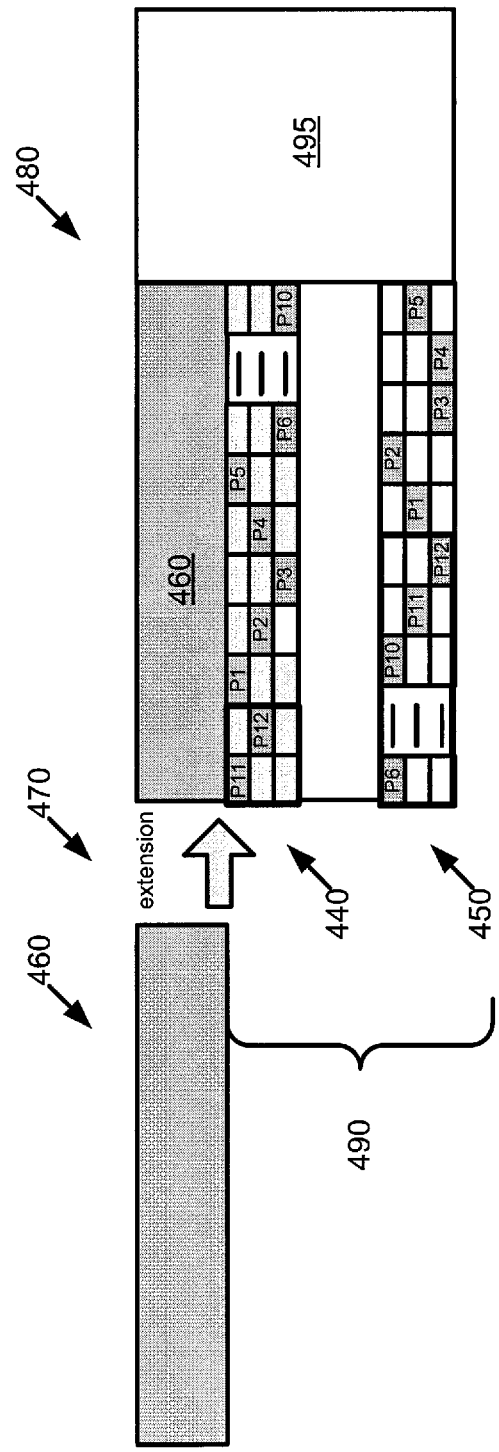
FIG. 6C
FIG. 6D

US 10,979,084 B2

METHOD AND APPARATUS FOR VECTOR BASED LDPC BASE MATRIX USAGE AND GENERATION

RELATED APPLICATION

This application was originally filed as PCT Application No. PCT/CN2017/070377 on Jan. 6, 2017.

TECHNICAL FIELD

This invention relates generally to wireless communications and, more specifically, relates to error correction codes used for the wireless communications.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section. Abbreviations that may be found in the specification and/or the drawing figures are defined below, after the main part of the detailed description section.

There are many different error correction codes used in wireless communication. Such codes allow certain types of errors to be corrected during decoding of received information.

Low Density Parity Check (LDPC) is a type of error correction code, which is already used in 802.11n, 802.16e, and many other standards. Recently, LDPC has received more attention as a promising coding scheme to fulfill next generation (i.e., 5G) mobile radio requirements.

In particular, LDPC has been selected as channel coding for eMBB in 5G. It would therefore be beneficial to improve LDPC.

BRIEF SUMMARY

This section is intended to include examples and is not intended to be limiting.

In an exemplary embodiment, a method comprises applying a base matrix to an LDPC coder, wherein the base matrix is comprised of multiple parts, each part comprising a plurality of rows and columns and the base matrix comprised of integers, wherein each integer is representative of an identity matrix cyclically shifted in accordance with the integer or representative of an all-zero matrix. At least two of the multiple parts are configured such that their respective column-wise combinations of rows represents a same starting vector, cyclically shifted or interleaved, with zero or more but not all integers not indicative of the all-zero matrix of the same vector substituted by integers indicative of the all-zero matrix, wherein the at least two of the multiple parts are not identical. The method also comprises using the applied base matrix, one of encoding data using the LDPC coder or decoding data using the LDPC coder.

An additional example of an embodiment includes a computer program, comprising code for performing the method of the previous paragraph, when the computer program is run on a processor. The computer program according to this paragraph, wherein the computer program is a computer program product comprising a computer-readable medium bearing computer program code embodied therein for use with a computer.

An example of an apparatus includes one or more processors and one or more memories including computer program code. The one or more memories and the computer program code are configured to, with the one or more processors, cause the apparatus to perform at least the following: applying a base matrix to an LDPC coder, wherein the base matrix is comprised of multiple parts, each part comprising a plurality of rows and columns and the base matrix comprised of integers, wherein each integer is representative of an identity matrix cyclically shifted in accordance with the integer or representative of an all-zero matrix, wherein at least two of the multiple parts are configured such that their respective column-wise combinations of rows represents a same starting vector, cyclically shifted or interleaved, with zero or more but not all integers not indicative of the all-zero matrix of the same vector substituted by integers indicative of the all-zero matrix, wherein the at least two of the multiple parts are not identical; and using the applied base matrix, one of encoding data using the LDPC coder or decoding data using the LDPC coder.

An example of a computer program product includes a computer-readable storage medium bearing computer program code embodied therein for use with a computer. The computer program code includes: code for applying a base matrix to an LDPC coder, wherein the base matrix is comprised of multiple parts, each part comprising a plurality of rows and columns and the base matrix comprised of integers, wherein each integer is representative of an identity matrix cyclically shifted in accordance with the integer or representative of an all-zero matrix, wherein at least two of the multiple parts are configured such that their respective column-wise combinations of rows represents a same starting vector, cyclically shifted or interleaved, with zero or more but not all integers not indicative of the all-zero matrix of the same vector substituted by integers indicative of the all-zero matrix, wherein the at least two of the multiple parts are not identical; and code for using the applied base matrix, one of encoding data using the LDPC coder or decoding data using the LDPC coder.

In another example of an embodiment, an apparatus comprises: means for applying a base matrix to an LDPC coder, wherein the base matrix is comprised of multiple parts, each part comprising a plurality of rows and columns and the base matrix comprised of integers, wherein each integer is representative of an identity matrix cyclically shifted in accordance with the integer or representative of an all-zero matrix, wherein at least two of the multiple parts are configured such that their respective column-wise combinations of rows represents a same starting vector, cyclically shifted or interleaved, with zero or more but not all integers not indicative of the all-zero matrix of the same vector substituted by integers indicative of the all-zero matrix, wherein the at least two of the multiple parts are not identical; and means for using the applied base matrix, one of encoding data using the LDPC coder or decoding data using the LDPC coder.

The examples above may be implemented as part of a user equipment and/or a base station. A communication system can include two apparatus that implements the examples provided above, e.g., where a first apparatus performs encoding of data and transmission of the encoded data and a second apparatus performs receiving the transmitted data and decoding of the received data.

BRIEF DESCRIPTION OF THE DRAWINGS

In the attached Drawing Figures:

FIG. 4C illustrates a cyclic shift for another set of multiple rows from FIG. 4A;

FIG. 4D illustrates use of the two generated sets of rows as parts of an extension part of one rate-compatible base matrix;

FIG. 6C illustrates a cyclic shift for another set of multiple rows from FIG. 6A;

FIG. 6D illustrates use of the two generated sets of rows as parts of an extension part of one rate-compatible base matrix;

DETAILED DESCRIPTION OF THE DRAWINGS

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The following disclosure is divided into sections for ease of reference.

Possible System

The exemplary embodiments herein describe techniques for error correction. Additional description of these techniques is presented after a system into which the exemplary embodiments may be used is described.

Figure 1:
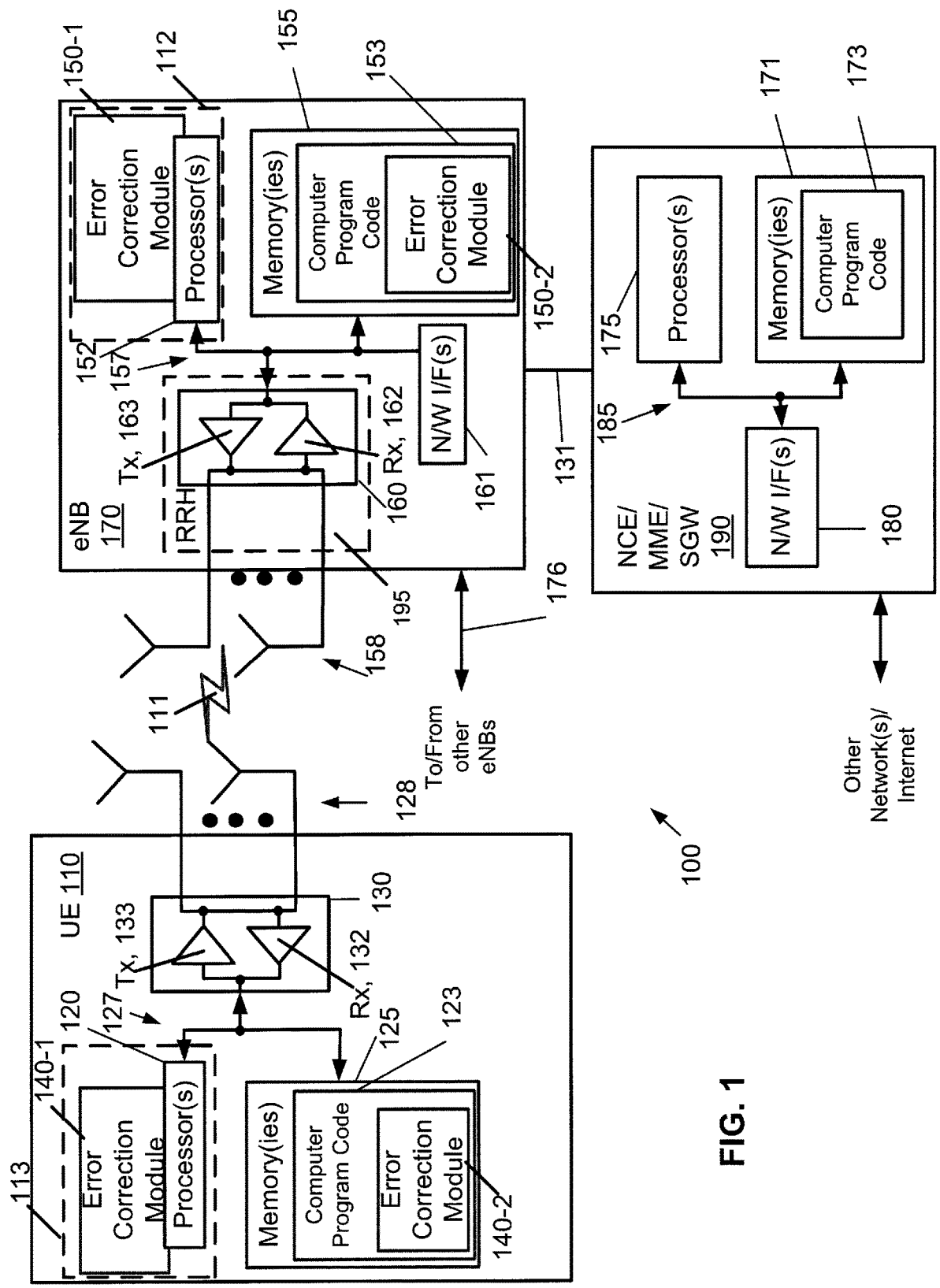
FIG. 1 is a block diagram of one possible and non-limiting exemplary system in which the exemplary embodiments may be practiced.

Turning to FIG. 1, this figure shows a block diagram of one possible and non-limiting exemplary system in which the exemplary embodiments may be practiced. In FIG. 1, a user equipment (UE) 110 is in wireless communication with a wireless network 100. A UE is a wireless, typically mobile device that can access a wireless network. The UE 110 includes one or more processors 120, one or more memories 125, and one or more transceivers 130 interconnected through one or more buses 127. Each of the one or more transceivers 130 includes a receiver, Rx, 132 and a transmitter, Tx, 133. The one or more buses 127 may be address, data, or control buses, and may include any interconnection mechanism, such as a series of lines on a motherboard or integrated circuit, fiber optics or other optical communication equipment, and the like. The one or more transceivers 130 are connected to one or more antennas 128. The one or more memories 125 include computer program code 123. The UE 110 includes an error correction module 140, comprising one of or both parts 140-1 and/or 140-2, which may be implemented in a number of ways. The error correction module 140 may be implemented in hardware as error correction module 140-1, such as being implemented as part of the one or more processors 120. The error correction module 140-1 may be implemented also as an integrated circuit (illustrated by reference 113 and commonly called a "chip") or through other hardware such as a programmable gate array. In another example, the error correction module 140 may be implemented as error correction module 140-2, which is implemented as computer program code 123 and is executed by the one or more processors 120. For instance, the one or more memories 125 and the computer program code 123 may be configured to, with the one or more processors 120, cause the user equipment 110 to perform one or more of the operations as described herein. The UE 110 communicates with eNB 170 via a wireless link 111.

The eNB (evolved NodeB) 170 is a base station (e.g., for LTE, long term evolution) that provides access by wireless devices such as the UE 110 to the wireless network 100. The eNB 170 includes one or more processors 152, one or more memories 155, one or more network interfaces (N/W I/F(s)) 161, and one or more transceivers 160 interconnected through one or more buses 157. Each of the one or more transceivers 160 includes a receiver, Rx, 162 and a transmitter, Tx, 163. The one or more transceivers 160 are connected to one or more antennas 158. The one or more memories 155 include computer program code 153. The eNB 170 includes an error correction module 150, comprising one of or both parts 150-1 and/or 150-2, which may be implemented in a number of ways. The error correction module 150 may be implemented in hardware as error correction module 150-1, such as being implemented as part of the one or more processors 152. The error correction module 150-1 may be implemented also as an integrated circuit (illustrated by reference 112 and commonly called a "chip") or through other hardware such as a programmable gate array. In another example, the error correction module 150 may be implemented as error correction module 150-2, which is implemented as computer program code 153 and is executed by the one or more processors 152. For instance, the one or more memories 155 and the computer program code 153 are configured to, with the one or more processors 152, cause the eNB 170 to perform one or more of the operations as described herein. The one or more network interfaces 161 communicate over a network such as via the links 176 and 131. Two or more eNBs 170 communicate using, e.g., link 176. The link 176 may be wired or wireless or both and may implement, e.g., an X2 interface.

The one or more buses 157 may be address, data, or control buses, and may include any interconnection mechanism, such as a series of lines on a motherboard or integrated circuit, fiber optics or other optical communication equipment, wireless channels, and the like. For example, the one or more transceivers 160 may be implemented as a remote radio head (RRH) 195, with the other elements of the eNB 170 being physically in a different location from the RRH, and the one or more buses 157 could be implemented in part as fiber optic cable to connect the other elements of the eNB 170 to the RRH 195.

The wireless network 100 may include a network control element (NCE) 190 that may include MME (Mobility Management Entity)/SGW (Serving Gateway) functionality, and which provides connectivity with a further network, such as a telephone network and/or a data communications network (e.g., the Internet). The eNB 170 is coupled via a link 131 to the NCE 190. The link 131 may be implemented as, e.g., an S1 interface. The NCE 190 includes one or more processors 175, one or more memories 171, and one or more network interfaces (N/W I/F(s)) 180, interconnected through one or more buses 185. The one or more memories 171 include computer program code 173. The one or more memories 171 and the computer program code 173 are configured to, with the one or more processors 175, cause the NCE 190 to perform one or more operations.

The computer readable memories 125, 155, and 171 may be of any type suitable to the local technical environment and may be implemented using any suitable data storage technology, such as semiconductor based memory devices, flash memory, magnetic memory devices and systems, optical memory devices and systems, fixed memory and removable memory. The computer readable memories 125, 155, and 171 may be means for performing storage functions. The processors 120, 152, and 175 may be of any type suitable to the local technical environment, and may include one or more of general purpose computers, special purpose computers, microprocessors, digital signal processors (DSPs) and processors based on a multi-core processor architecture, as non-limiting examples. The processors 120, 152, and 175 may be means for performing functions, such as controlling the UE 110, eNB 170, and other functions as described herein.

In general, the various embodiments of the user equipment 110 can include, but are not limited to, cellular telephones such as smart phones, tablets, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, tablets with wireless communication capabilities, as well as portable units or terminals that incorporate combinations of such functions.

Overview

Having thus introduced one suitable but non-limiting technical context for the practice of the exemplary embodiments of this invention, the exemplary embodiments will now be described with greater specificity.

As previously described, LDPC has been selected as channel coding for eMBB in 5G. This occurred in part in a 3GPP RAN1 #87 meeting. For the UL eMBB data channels, the working assumption was to adopt flexible LDPC as the single channel coding scheme for small block sizes (to be confirmed unless significant issues are identified). It was previously already agreed upon to adopt LDPC for large block sizes. In this meeting, for the DL eMBB data channels, it was agreed to adopt flexible LDPC as the single channel coding scheme for all block sizes.

Further, it is also agreed that IR HARQ should be supported for LDPC in 5G, as agreement was reached for this in the 3GPP RAN1 #86 meeting. Additional agreement was reached for channel coding technique(s) designed for data channels of NR support both Incremental Redundancy (IR) (or similar) and Chase Combining (CC) HARQ.

Moreover, agreement was reached in the 3GPP RAN1 #87 meeting that code extension of a parity-check matrix is used for IR HARQ/rate-matching support, and lower-triangular extension, which includes diagonal-extension as a special case, would be used.

Thus, LDPC is gaining acceptance and prominence for 5G. The instant inventions are directed toward improving the LDPC and the use of LDPC.

As an introduction, details of LDPC are more often discussed in association with the parity check matrix (PCM), which is used for encoding and decoding. Among different variants of LDPC, quasi-cyclic (QC) LDPC is considered as the most practical way of using LDPC codes in realistic situations. In QC-LDPC, the PCM can be generated by expanding a base matrix based on the expansion factor Z, where the base matrix can be defined as the following:

$$\text{Base matrix} = [P_{1,1}, P_{1,2}, P_{1,3}, \ldots P_{1,N}$$
$$P_{2,1}, P_{2,2}, P_{2,3}, \ldots P_{2,N}$$
$$\ldots\ldots\ldots\ldots\ldots\ldots\ldots\ldots$$
$$P_{M,1}, P_{M,2}, P_{M,3} \ldots P_{M,N}],$$

where $P_{i,j}$ equals −1 or a non-negative value, i=1,2, . . . M, and j=1,2, . . . N.

When generating the PCM, the following is performed:

1) if $P_{i,j}$=−1, it will be replaced by an all-zero matrix with size Z*Z;

2) if $P_{i,j}$ is a non-negative value, it will be replaced by cyclic-permutations of the identity matrix with size Z*Z, where the cyclic-permutation is based on the value of the $P_{i,j}$, e.g., if $P_{i,j}$=5, Z=8, then the cyclic-permutations of the identity matrix will be as following:

```
0 0 0 0 0 1 0 0
0 0 0 0 0 0 1 0
0 0 0 0 0 0 0 1
1 0 0 0 0 0 0 0
0 1 0 0 0 0 0 0
0 0 1 0 0 0 0 0
0 0 0 1 0 0 0 0
0 0 0 0 1 0 0 0
```

Considering a corresponding Tanner graph of the PCM, constructions should satisfy some PCM criteria, e.g., avoid length four circles or keep a low ratio of length four circles or keep a good girth profile with low ratio of small (e.g., four, six) circles in the Tanner graph. Otherwise, the performance of the LDPC coding scheme has been found to be not that good. For example, the PEG method can be used to generate the PCM that guarantees the aforementioned requirements. As is known, the girth g of the code is the length of the shortest circle in its Tanner graph. The girth profile is the profile of the length of the circle in its Tanner graph.

For LDPC, message passing is used in decoding, where there is message passing from a variable node to a check node and from the check node to the variable node. The Min-Sum decoding scheme is one practical scheme with less complexity, which is selected as an effective implementable decoding scheme. In Min-Sum decoding, comparison and selection are used for message selection and passing.

Layered decoding is one important decoding scheme with high implementation efficiency, e.g. smaller chip area (e.g., for integrated circuit 112 or 113 or both) and smaller number of iterations as compared with the flooding decoding. In layered decoding, several rows are row orthogonal (that is, there is at most one element not indicative of an all-zero matrix per column of multiple rows or equivalently at most one identity matrix cyclic shift value per column of multiple rows) and are column-wise combined into one row as one layer in decoding.

Figure 2:
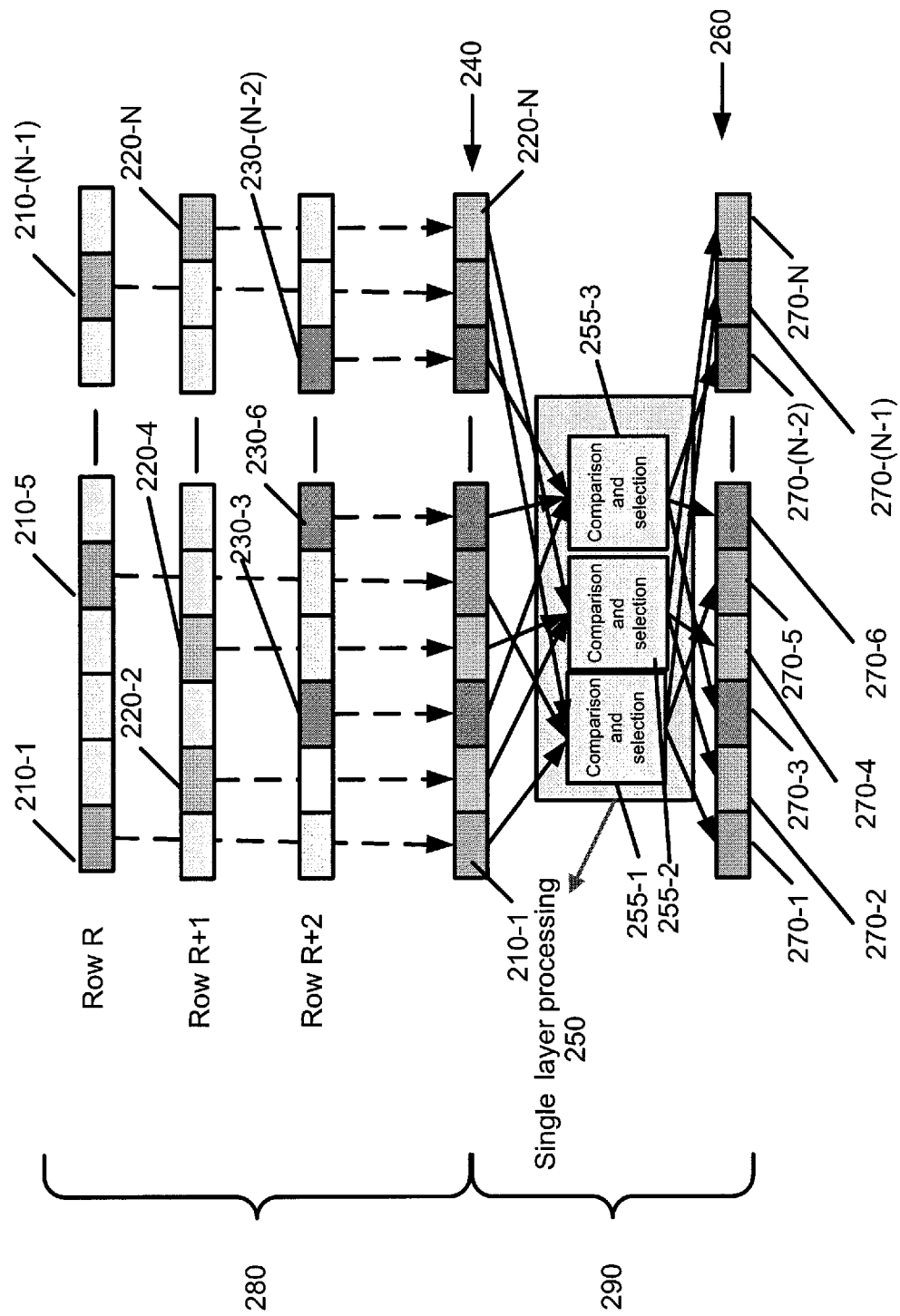
FIG. 2 illustrates both row orthogonality in part of an LDPC base matrix and message passing in single layer decoding processing.

Turning to FIG. 2, this figure illustrates both row orthogonality in part of an LDPC base matrix (illustrated by reference 280) and message passing in single layer decoding processing (illustrated by reference 290). As illustrated by reference 280, rows R, R+1, and R+2 are rows of (or a subset of columns of rows of) an LDPC base matrix and are combined into one row 240. The row 240 is comprised of values from left to right as follows: value 210-1 from row R; value 220-2 from row R+1; value 230-3 from row R+2; value 220-4 from row R+1; value 210-5 from row R; value 230-6 from row R+2; . . . ; value 230-(N-2) from row R+2; value 210-(N-1) from row R; and value 220-N from row R+1. In the message passing in single layer decoding processing 290, the single layer processing 250 comprises a number of comparison and selection processes 255-1, 255-2, and 255-3 performed as follows: process 255-1 uses the values 210-1, 210-5, and 210-(N-1) from row 210; process 255-2 uses the values 220-2, 220-4, and 210-N from row 220; and process 255-3 uses the values 230-3, 230-6, and 230-(N-2) from row 230. The single layer processing 250 performs operations equivalent to the message passing between the variable and check nodes. Each of these processes 255 outputs their respective output values in the same order. The output is row 260, comprising values 270-1, 270-2, 270-3, 270-4, 270-5, 270-6, . . . , 270-(N-2), 270-(N-1), and 270-N.

Although such single layer decoding processing is valuable (and may be used herein), in 5G and especially for eMBB, the block size could be very large considering the requirement of Gbps throughput. A general case could be that there are hundreds of code blocks in one transmission and each block contains as many as 5000~8000 information bits. Based on the requirement of this general case from 5G, to achieve high throughput, multiple parallel LDPC decoders should be implemented in one terminal, e.g., a UE, and the number of decoders in an eNB might be several times the number of decoders implemented in a single UE. Meanwhile, in each decoder, there should be implementations of multiple layers, and all these layers should be optimized separately to guarantee high decoding speed and low energy consumption. This is a significant challenge.

In the general design of an LDPC base matrix, the $P_{i,j}$ are not related to each other, so for each layer, there should be different switching networks to pass the messages from each block based on the independent $P_{i,j}$. This switching network is one main component in min-sum decoder for LDPC and will occupy a large ratio of chip area (such as in semiconductors 112 or 113 or both) in each parallel decoder. It is a problem as how to reduce the complexity and chip area of the switching network.

The exemplary embodiments herein improve the current LDPC base matrix and PCM generation and use. In particular, the LDPC base matrix is adapted such that it comprises a plurality of typically non-identical, row-orthogonal parts, each part having a column-wise combination of rows that may be derived from a single vector common for the parts by, for each part, at most replacement of less than all of the vector values by values indicative of an all-zero matrix (typically denoted as −1) and one of cyclic shifting or interleaving of the resultant rows in a part and modification of the rows with zero or more elements consisting of values indicative only of the all-zero matrix. Such parts may be generated by a variety of techniques. In particular, in an exemplary aspect, the following techniques may be used:

Technique 1: Use one (e.g., starting) vector to generate two (or more) sets of multiple orthogonal rows, where the starting vector includes multiple values, each value being a non-negative value or −1 (as described above).

Technique 2: Perform cyclic shifting (or interleaving) of each set of the multiple orthogonal rows to generate the parts of the base matrix.

Now that an overview has been provided, additional detail is provided.

Base Matrix and PCM Considerations

The base matrix and PCM are used for encoding and decoding, and overall flows describing encoding and decoding are described below. Before that, though, base matrix and PCM considerations are described.

In an exemplary aspect, the base matrix can be one base matrix for some code rate or a rate-compatible base matrix that supports IR HARQ or supports multiple code rates based on different parts of the base matrix. For rate-compatible base matrix, we consider the method of extension from a base matrix supporting a high code rate to a final extended base matrix supporting a low code rate. Two exemplary methods are described in detail below.

Figure 3:
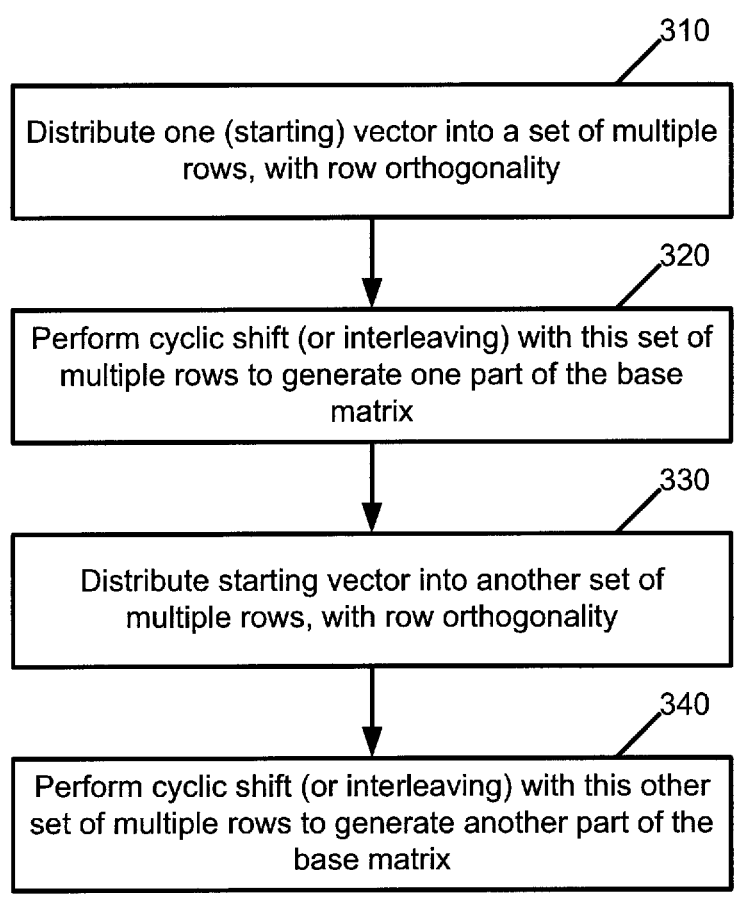
FIG. 3 is a logic flow diagram for matrix generation with row reusing and shifting for LDPC in one exemplary embodiment, and illustrates the operation of an exemplary method, a result of execution of computer program instructions embodied on a computer readable memory, functions performed by logic implemented in hardware, and/or interconnected means for performing functions in accordance with exemplary embodiments.

A first exemplary method is described in reference to FIG. 3. FIG. 3 is a logic flow diagram for matrix generation with row reusing and shifting for LDPC. This figure further illustrates the operation of an exemplary method, a result of execution of computer program instructions embodied on a computer readable memory, functions performed by logic implemented in hardware, and/or interconnected means for performing functions in accordance with exemplary embodiments.

In this exemplary method, one (starting) vector is distributed into a set of multiple rows (see block 310), with row orthogonality, where the starting vector includes multiple non-negative values. Block 320 involves performing a cyclic shift of the set of multiple rows to generate one part of the base matrix. In block 330, the same starting vector is reused and the starting vector is distributed into another set of multiple rows, with row orthogonality. A cyclic shift is performed in block 340 of the other set of multiple rows to generate another part of the base matrix. It is noted the examples described herein use different cyclic shifts for blocks 320 and 340, but the same number of shifts may be performed for blocks 320 and 340. Furthermore, while cyclic shifting is described in reference blocks 320 and 340 (corresponding to FIGS. 4B and 4C, respectively) interleaving may be performed instead (e.g., see FIG. 8).

Figure 4A:
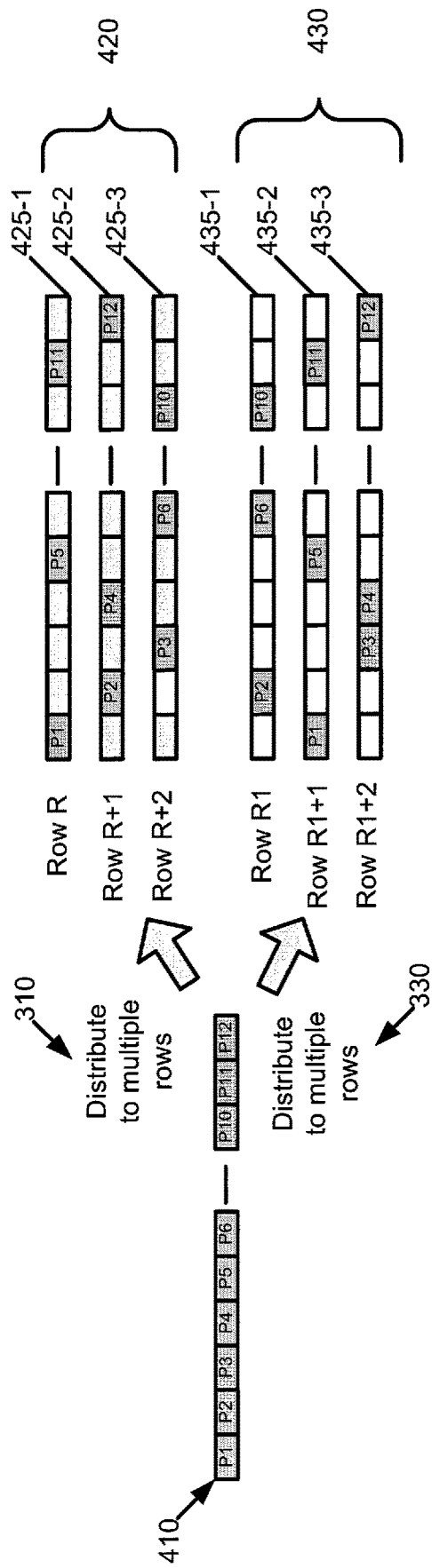
FIG. 4A illustrates two distributions of sets of multiple rows in accordance with operations in FIG. 3.
Figure 4B:
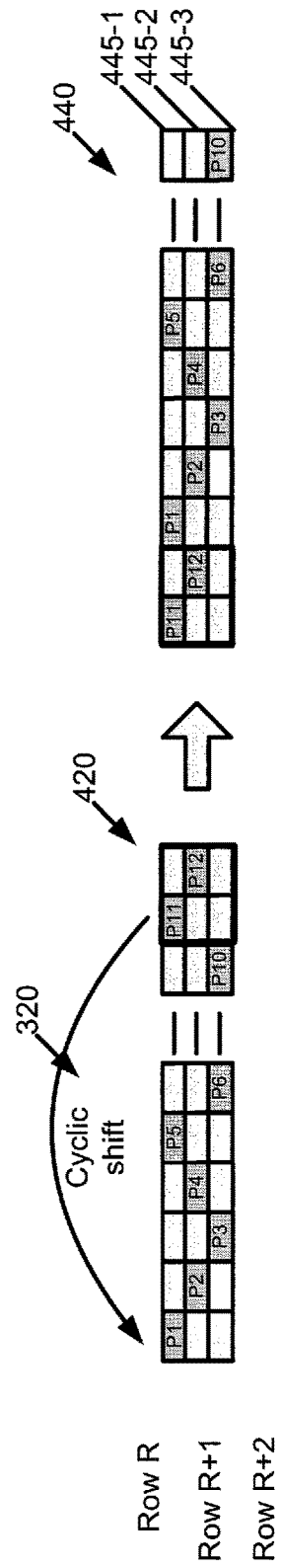
FIG. 4B illustrates a cyclic shift for one set of multiple rows from FIG. 4A.

Certain operations in these blocks are illustrated in FIGS. 4A-4C. FIG. 4A illustrates two distributions of sets of multiple rows in accordance with operations in FIG. 3, FIG. 4B illustrates a cyclic shift for one set of multiple rows from FIG. 4A, and FIG. 4C illustrates a cyclic shift for another set of multiple rows from FIG. 4A. Furthermore, FIG. 4D illustrates use of the two generated sets of rows as parts of an extension part of one rate-compatible base matrix.

In the following example shown in FIGS. 4A-4C, one starting vector is distributed into three orthogonal rows and cyclic shifted to generate one part of base matrix, and the same starting vector is distributed into another three orthogonal rows and cyclic shifted to generate another part of the base matrix. FIG. 4A illustrates a starting vector 410 comprising values P1 through P12. This starting vector 410 is distributed (reference 310) to a set 420 of rows 425-1, 425-2, and 425-3 in this example. The same starting vector 410 is distributed (reference 330) to another set 430 of rows 435-1, 435-2, and 435-3. Each of the values P1 through P12 represents a shift value for an identity matrix (generally indicated by a non-negative integer value) and the "blank" values represent all-zero matrices (generally indicated with −1). The number of rows is merely illustrative, as is the number of values for individual rows.

FIG. 4B illustrates a cyclic shift 320, where the last two values in rows 425 for the set 420 are shifted to the beginning of the rows to create the set 440 of rows, with rows 445-1, 445-2, and 445-3 after the cyclic shift. FIG. 4C illustrates a cyclic shift 340, where the last six values in rows 435 for the set 430 are shifted to the beginning of the rows to create the set 450 of rows, with rows 455-1, 455-2, and 455-3 after the cyclic shift.

In this example, the generated two parts 440, 450 are used as an extension part of one rate-compatible base matrix, where the extension is from a base matrix supporting a high code rate. This is illustrated by FIG. 4D, where an extension operation 470 is performed on a base matrix 460 to form a rate-compatible base matrix 480 with an extension 490 comprising the sets 440, 450 of rows. In general, the area 495 should contain nothing but elements indicating all-zero matrices next to the grey part 460, but should not have all only elements indicating all-zero matrices next to the added parts 440, 450. In this example, the width of 440 and 450 are same as the width of 460. It should be noted that the width of 440 and 450 could be less than the width of 460 in other cases. In some cases, parts 440 and 450 may consist of a subset of the number of columns of 460 where remaining columns may be comprised of elements indicating all-zero matrices.

Figure 5:
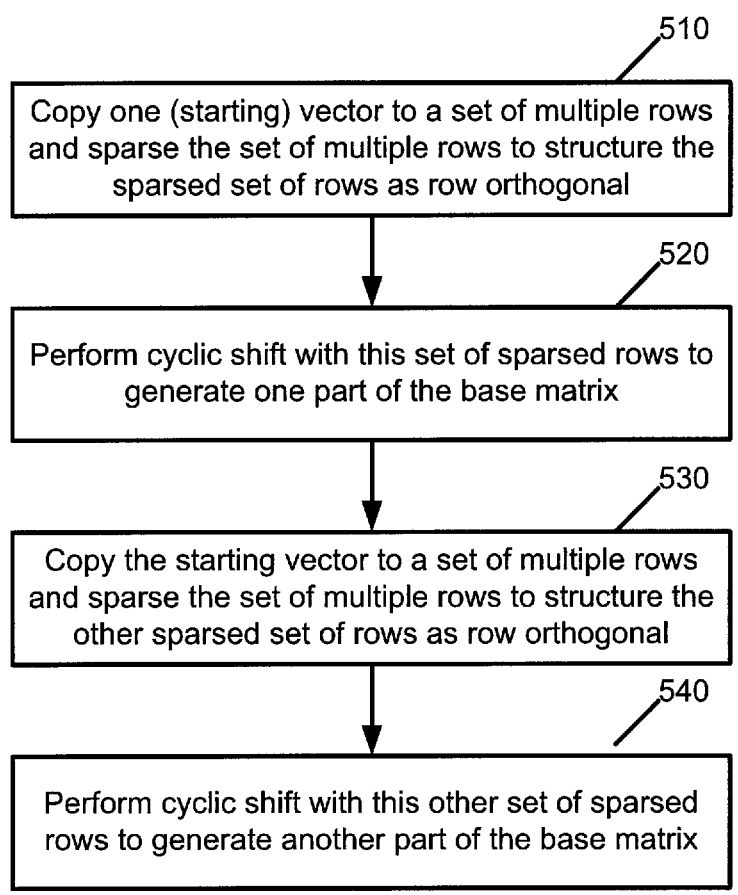
FIG. 5 is a logic flow diagram for matrix generation with row reusing and shifting for LDPC in another exemplary embodiment, and illustrates the operation of an exemplary method, a result of execution of computer program instructions embodied on a computer readable memory, functions performed by logic implemented in hardware, and/or interconnected means for performing functions in accordance with exemplary embodiments.

A second exemplary method is described in reference to FIG. 5. In block 510, one (starting) vector is copied to multiple rows and the multiple rows are sparsed to structure the sparsed set of rows as row orthogonal, where the starting vector includes multiple non-negative values. Sparsing means each of the values P1 through P12 is indicative of a shift value of an identity matrix (generally indicated by a non-negative integer) and the "blank" values are indicative of all-zero matrices (general indicated by −1), and the "blank" values are placed in locations where the values P1 through P12 are not placed. In other words, it is determined how to make a resultant sparsed set of rows such that each set of rows only contain one value of P1 through P12 in its original column position in one of the rows, and the other values for other rows for that column position contain indications of all-zero matrices.

In block 520, the set of sparsed rows is cyclic shifted to generate one part of the base matrix. In block 530, the starting vector is copied to another set of multiple rows and the set of multiple rows are sparsed as described above to structure the other set of sparsed rows as row orthogonal. Note that the number of rows in the set of multiple rows may be different between blocks 510 and 530, see, e.g., FIGS. 7 and 8. In block 540, the other set of sparsed rows is cyclic shifted to generate another part of the base matrix. While cyclic shifting is described in reference blocks 520 and 540 (corresponding to FIGS. 6B and 6C, respectively) interleaving may be performed instead (e.g., see FIG. 8).

Figure 6A:
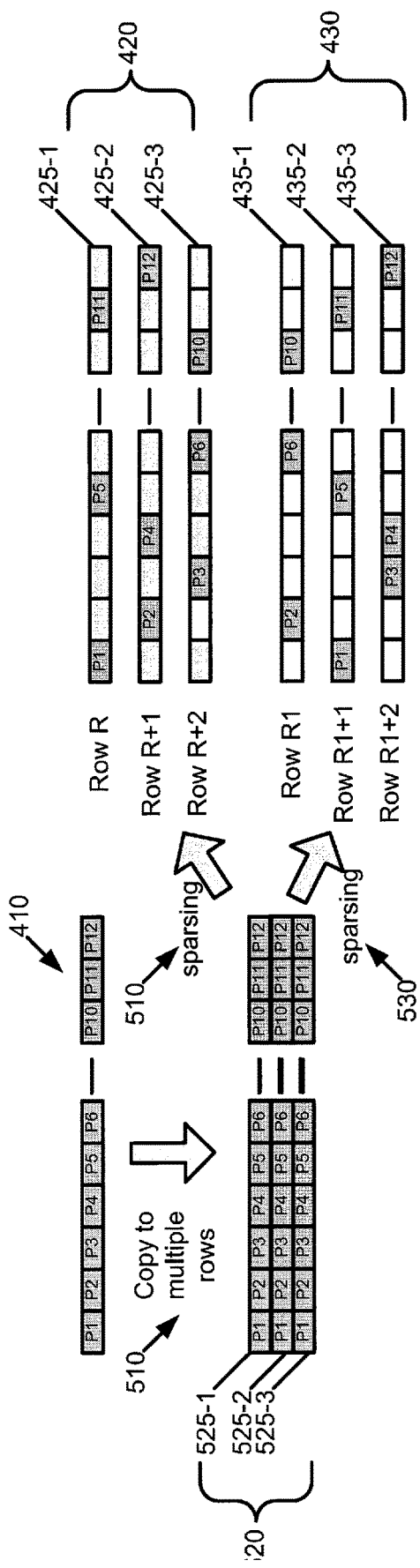
FIG. 6A illustrates copying a row into multiple rows and performing multiple sparsing operations in accordance with operations in FIG. 5.
Figure 6B:
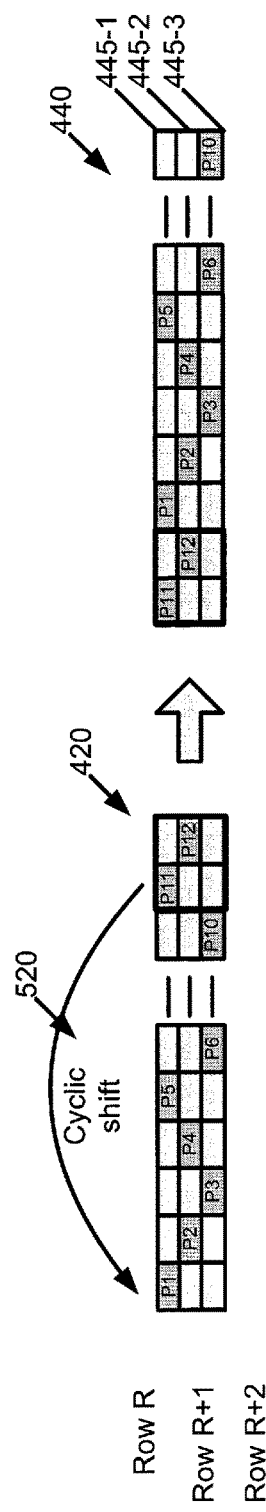
FIG. 6B illustrates a cyclic shift for one set of multiple rows from FIG. 6A.

Certain operations in these blocks are illustrated in FIGS. 6A-6C. FIG. 6A illustrates copying a starting vector into multiple rows and performing multiple sparsing operations in accordance with operations in FIG. 5, FIG. 6B illustrates a cyclic shift for one set of multiple rows from FIG. 6A, and FIG. 6C illustrates a cyclic shift for another set of multiple rows from FIG. 6A. Additionally, FIG. 6D illustrates use of the two generated sets of rows as parts of an extension part of one rate-compatible base matrix.

In the following example shown in FIGS. 6A-6C, one starting row is copied into multiple rows and those rows are sparsed to create two sets of orthogonal rows, and those sets are cyclic shifted to generate parts of a base matrix. FIG. 6A illustrates a starting row 410 comprising values P1 through P12. This starting row 410 is copied (reference 510) to a set 520 of copies 525-1, 525-2, and 525-3 in this example. The set 520 of copies 525 is sparsed (reference 510) to a set 420 of rows 425-1, 425-2, and 425-3. The set 520 of copies 525 is sparsed (reference 530) to another set 430 of rows 435-1, 435-2, and 435-3. Each of the values P1 through P12 is non-negative and the "blank" values are indicative of all-zero matrices. The sparsing therefore creates a set 420 of sparsed rows 425 where in each column position only at most one of the elements P1 through P12 is positioned and the other values in the rows 425 are indicative of all-zero matrices. Similarly, sparsing creates a set 430 of sparsed rows 435 where in each column position only one of the elements P1 through P12 is positioned and the other values in the rows 435 are indicative of all-zero matrices. The number of rows is merely illustrative, as is the number of values for individual rows.

FIG. 6B illustrates a cyclic shift 520, where the last two values in rows 425 for the set 420 are shifted to the beginning of the rows to create the set 440 of rows, with rows 445-1, 445-2, and 445-3 after the cyclic shift. FIG. 6C illustrates a cyclic shift 540, where the last six values in rows 435 for the set 430 are shifted to the beginning of the rows to create the set 450 of rows, with rows 455-1, 455-2, and 455-3 after the cyclic shift.

In this example, the generated two parts 440, 450 are used as an extension part of one rate-compatible base matrix, where the extension is from a base matrix supporting a high code rate. This is illustrated by FIG. 6D, where an extension operation 470 is performed on a base matrix 460 to form a rate-compatible base matrix 480 with an extension 490 comprising the sets 440, 450 of rows. See also FIG. 4D and its corresponding text.

Figure 7:
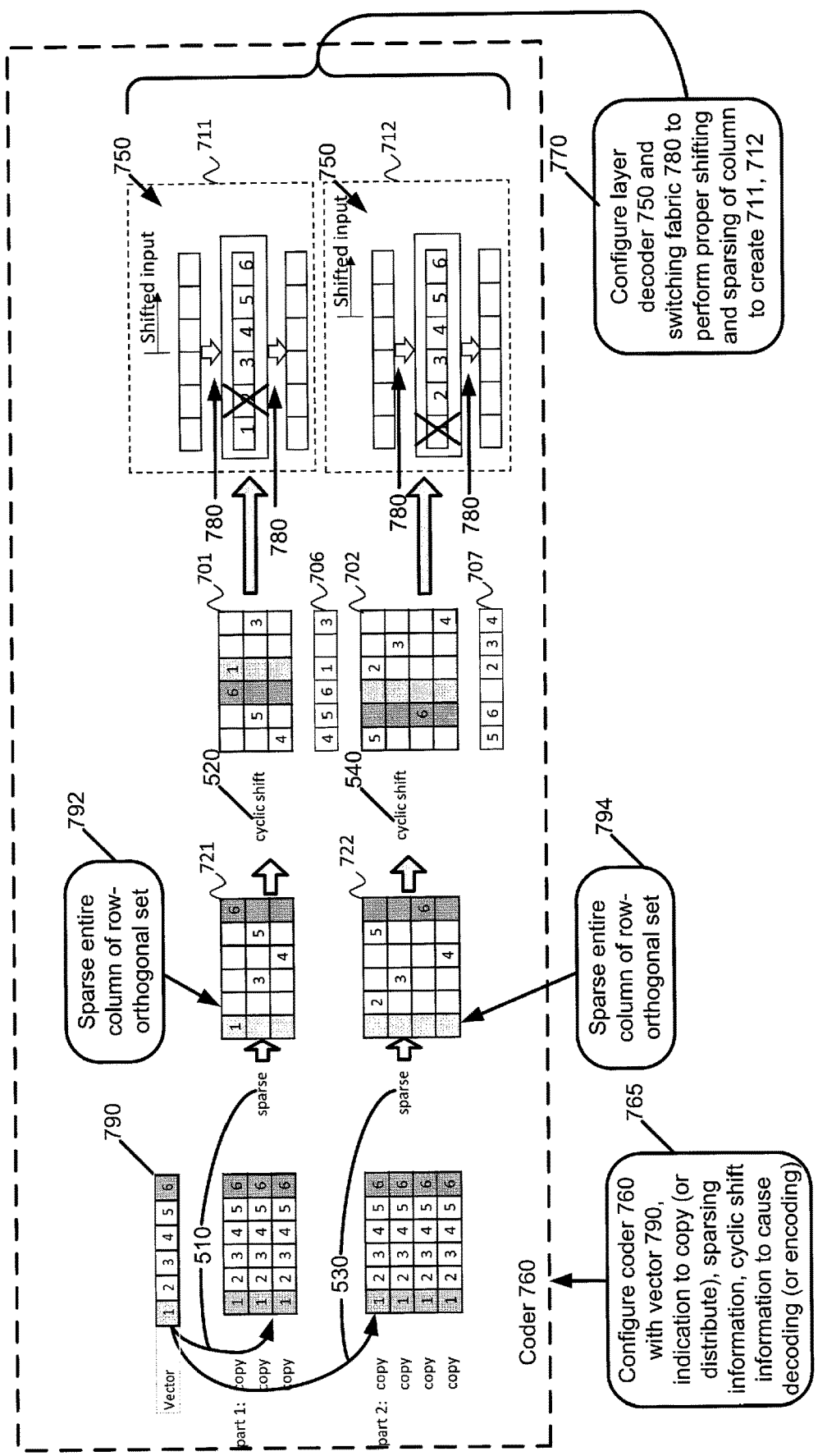
FIG. 7 illustrates configuration of a layer decoder in accordance with multiple sets of rows and exemplary derivation of the multiple sets of rows using cyclic shift.

Another example is depicted in FIG. 7. A layer decoder (711, 712) is configured in accordance with two sets 701 and 702 of multiple rows. More particularly, the layer decoder is configured with a switching fabric representative of the vector 790 of cyclic shift values [1 2 3 4 5 6]. The two sets 701, 702 of multiple rows are configured such that they are row-orthogonal and their corresponding column-wise combination (706, 707) is a sparsed and cyclic shifted representation of the same [1 2 3 4 5 6] vector 790. That is, column-wise combination 706 may be observed to correspond to [1 2 3 4 5 6] by a cyclic shift of three columns and replacement of element two (2) with an indication of an all-zero matrix, shown here as blank. In block 792, a sparsing of an entire column of the row-orthogonal set 721 is performed corresponding to element (2) of the original vector 790, and this sparsing is indicated in the column-wise combination 706 by the indication of an all-zero matrix. And column-wise combination 707 may be observed to be corresponding to [1 2 3 4 5 6] by cyclic shift of two and replacement of element one (1) with an indication of an all-zero matrix, shown here as blank. In block 794, a sparsing of an entire column of the row-orthogonal set 722 is performed corresponding to element (1) of the original vector 790, and this sparsing is indicated in the column-wise combination 707 by the indication of an all-zero matrix.

When processing data in accordance with the first set 701, the layer decoder 711 is configured by disablement of part of the switching fabric 780 corresponding to element two (2) and cyclic shifting of the input by three. When processing data in accordance with the second set 702, the layer decoder 712 is configured by disablement of the switching fabric part corresponding to element one (1) and cyclic shifting of the input by two. Disablement of a portion of the switching fabric 780 may for example be achieved by simple disablement of certain gates on the die at the ingress to the switching fabric, by preventing storage of the output of the portion of the switching fabric or by skipping reading the output of the portion of the switching fabric into a different memory. The input may be shifted by actual shifting of the data in the input memory or more conveniently by memory re-addressing. Both cyclic shifting and disabling require minimal amounts of additional logic. Because of this, layer decoders 711 and 712 may conveniently be the same layer decoder (unlike a conventional system, where two layer decoders would be necessary) configured in two different ways. This is illustrated by a layer decoder 750 and its switching fabric 780 being configured (see block 770) to perform proper shifting and sparsing of column to create layer decoders 711, 712. In an example, the error correction module 140/150 could perform the configuring in the block 770, and the layer decoder 750 and its switching fabric 780 could be implemented as part of the error correction module 140/150, or be implemented as part of a transmitter 133/163 (e.g., an encoder) or as part of a receiver 132/162 (e.g., as a decoder), separate from the error correction module 140/150. Other configurations are possible.

For example, it is possible that a single coder 760 (e.g., a decoder or encoder) could be configured (block 765) to perform the copying in blocks 510/530 (or distributing in blocks 310/330), the sparsing of the rows and individual columns (as in references 721 and 722), and the cyclic shifts for blocks 520/540, and further to create and implement the layer decoders 711/712 (as previously described). The single coder 760 could be implemented as part of the error correction module 140/150, or be implemented as part of a transmitter 133/163 (e.g., as an encoder) or as part of a receiver 132/162 (e.g., as a decoder), e.g., separate from the error correction module 140/150. The error correction module 140/150 may perform the operations in block 765, where the coder 760 is configured with vector 790, an indication to copy (or distribute), sparsing information (e.g., for rows and/or columns), and cyclic shift information (and any other suitable information) to cause LDPC decoding (or encoding).

In the embodiment depicted in FIG. 7, the two sets of multiple rows are derived in accordance with the process depicted in FIG. 5 from the vector 790 (starting row) [1 2 3 4 5 6] through copying and sparsing (510) the vector into 721 followed by cyclic shifting (520) and through copying and sparsing (530) the vector into 722 followed by cyclic shifting (540). In an alternate embodiment, the two sets 701 and 702 may be derived similarly with the process depicted in FIG. 3. The order of sparsing and cyclic shifting may naturally be reversed. As may be observed, sets 701 and 702 are depicted to have a different number of rows. There are generally no requirements that sets of multiple rows have the same number of rows.

Figure 8:
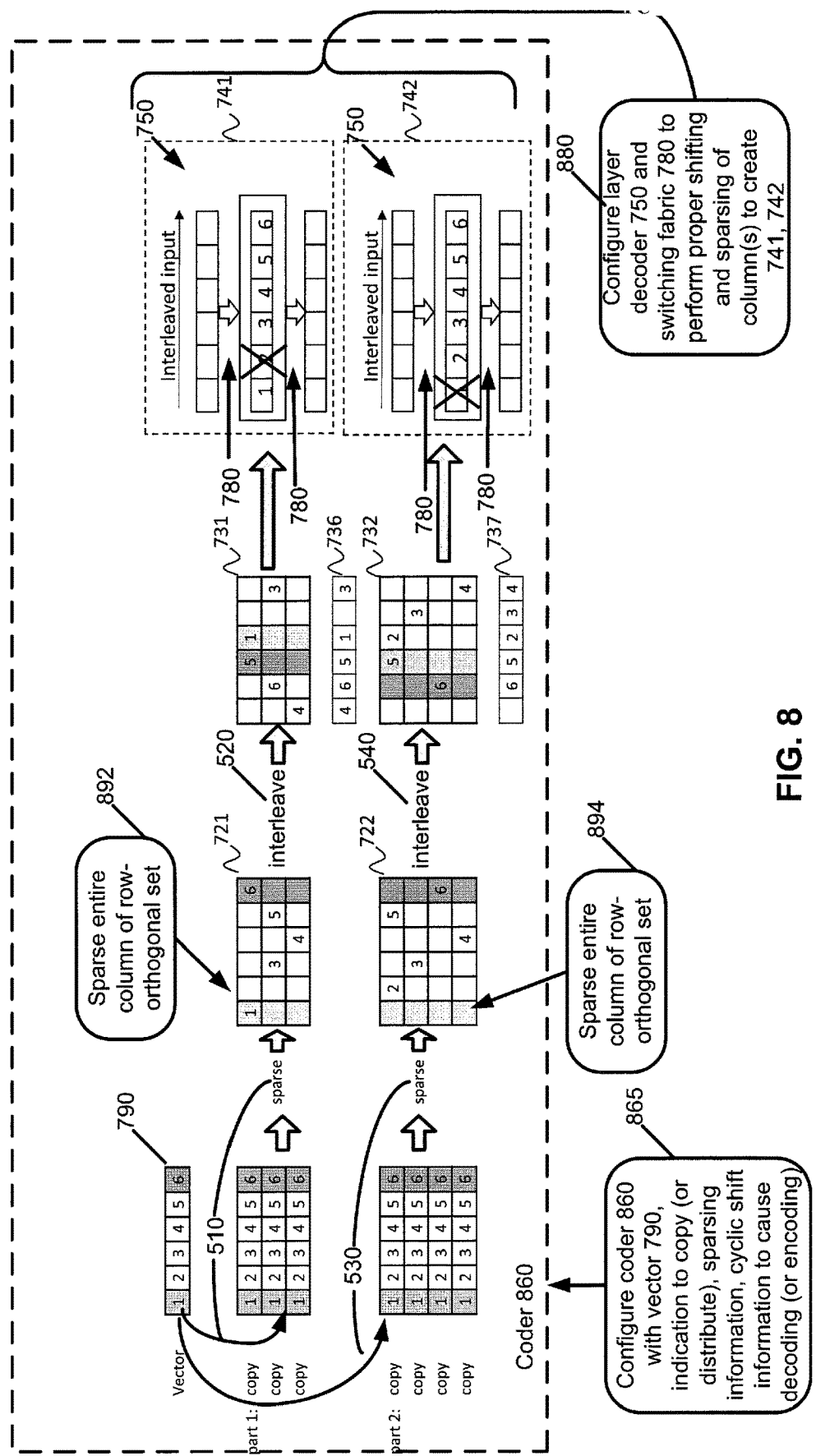
FIG. 8 illustrates configuration of a layer decoder in accordance with multiple sets of rows and exemplary derivation of the multiple sets of rows using interleaving.

FIG. 8 depicts another embodiment. This embodiments differs from that of FIG. 7 mainly in that instead of cyclic shifting, the column-wise combinations 736, 737 of the two sets of multiple rows 731 and 732 correspond to the vector [1 2 3 4 5 6] by interleaving (for blocks 520 and 540) and sparsing, rather than cyclic shifting and sparsing. Correspondingly, the input of the layer decoder (741, 742) must be interleaved. Entire columns are sparsed in blocks 892 and 894. As with FIG. 7, in FIG. 8, a layer decoder 750 and switching fabric 780 may be configured (block 880) to perform proper shifting and sparsing of column(s) to create layer decoders 741, 742. Furthermore, it is possible that a single coder 860 (e.g., a decoder or encoder) could be configured (block 865) to perform the copying in blocks 510/530 (or distributing in blocks 310/330), the sparsing of the rows and individual columns (as in references 721/892 and 722/894), and the interleaving for blocks 520/540. The single coder 860 could be implemented as part of the error correction module 140/150, or be implemented as part of a transmitter 133/163 (e.g., as an encoder) or as part of a receiver 132/162 (e.g., as a decoder). The error correction module 140/150 may perform the operations in block 865, where the coder 860 is configured with vector 790, an indication to copy (or distribute), sparsing information (e.g., for rows and/or columns), and cyclic shift information (and any other suitable information) to cause LDPC decoding (or encoding).

It should be understood that also embodiments are envisioned where one or more sets of multiple rows are corresponding to interleaving and one or more other sets of multiple rows are corresponding to cyclic shifting. A layer decoder capable of handling these sets will for such embodiments have an input interleaving capability, which for sets corresponding to cyclic shifting will have its input interleaving set to reflect the cyclic shift.

Figure 9:
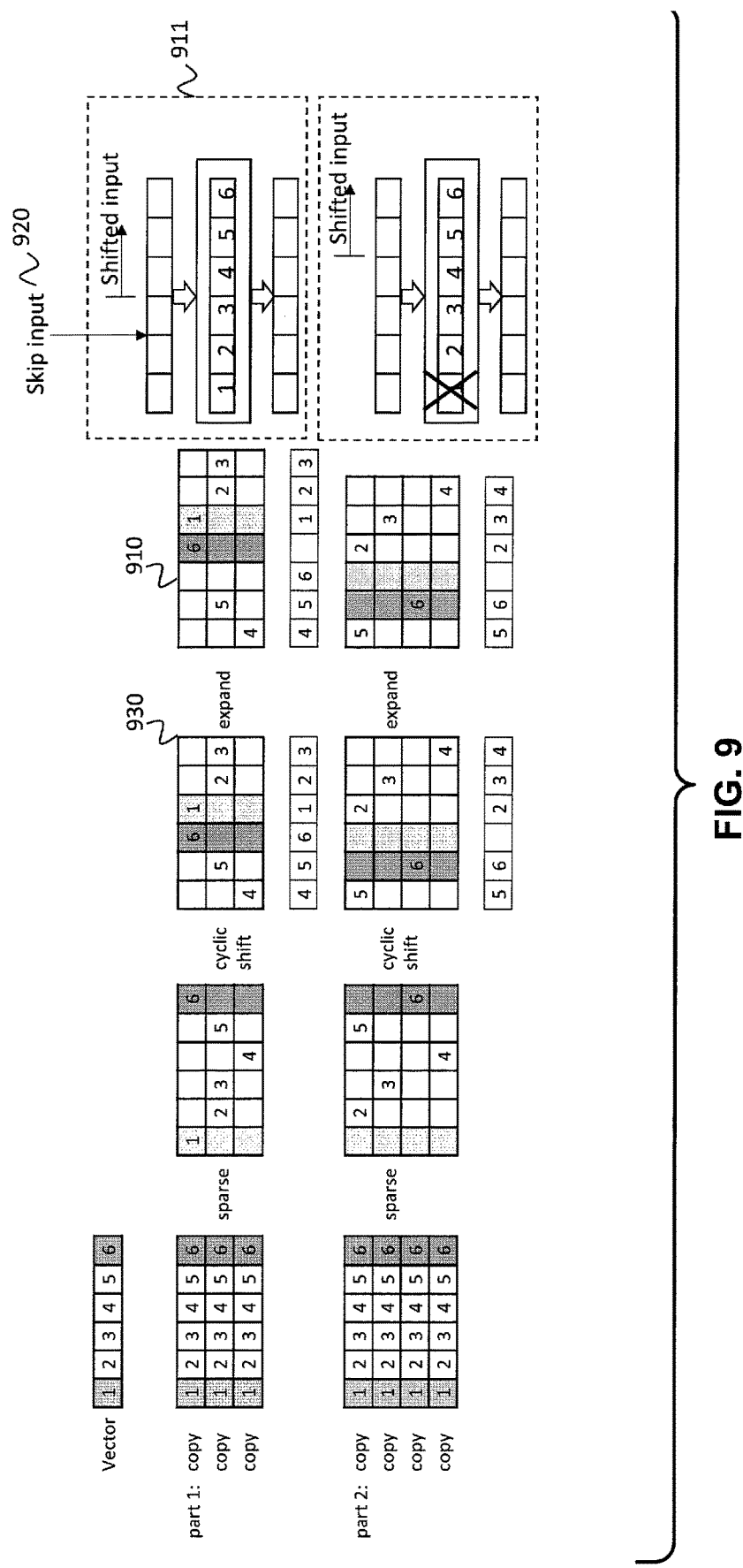
FIG. 9 illustrates configuration of a layer decoder in accordance with multiple sets of rows and exemplary derivation of the multiple sets of rows using cyclic shift and expansion.

FIG. 9 depicts another embodiment, which is similar to that depicted in FIG. 7 with the distinction that instead of block 792, the set of multiple rows 930 is expanded at 910 by inserting an additional column consisting of only values indicative of the all-zero matrix. The layer decoder 911 may be correspondingly configured to skip (reference 920) input data corresponding to the inserted column.

Possible Implementations

There are at least two implementation methods, as follows.

In an exemplary first implementation, one or more of the techniques presented above are used to generate the base matrix used in 5G, e.g., eMBB. The base matrix of the PCM is pre-generated according to one or more of the techniques above and stored in an eNB 170 (and/or UE 110), and the eNB 170 (and/or UE 110) use the base matrix (and/or PCM) for decoding.

In an exemplary second implementation, the eNB 170 (and/or UE 110) generates a base matrix (and/or PCM) according to one or more of the techniques presented above, and the eNB 170 (and/or UE 110) uses the base matrix (and/or PCM) for decoding.

The implementations mentioned above are based on a predefined base matrix. There can also be other ways to make the eNB and UE use the same base matrix, as the signaling between eNB and UE (most probably will be eNB configure to UE), where the signaling can include one or some combination of the following:

- An indicator to a row used for generation of sets of multiple rows; and/or
- An indicator for each set indicating how to distribute and/or sparse the row to generate the multiple rows and/or
- An indicator for the cyclic shift to be used for each set; and/or
- An indicator for an interleaving pattern to be applied for each set.

Furthermore, it is also possible to predefine some parameter and transmit some parameter based on signaling between eNB and UE. For example, a UE may store a plurality of vectors (starting rows), where the eNB may signal from which vector the UE should generate the sets of multiple rows. Because memory storage space for a vector (starting row) is significantly smaller than that of corresponding sets of multiple rows and many sets of multiple rows may be generated from the same vector by different sparsing and cyclic shifting or interleaving, combinations of significantly reduced storage space and more flexible base matrix selection can be achieved.

Figure 10:
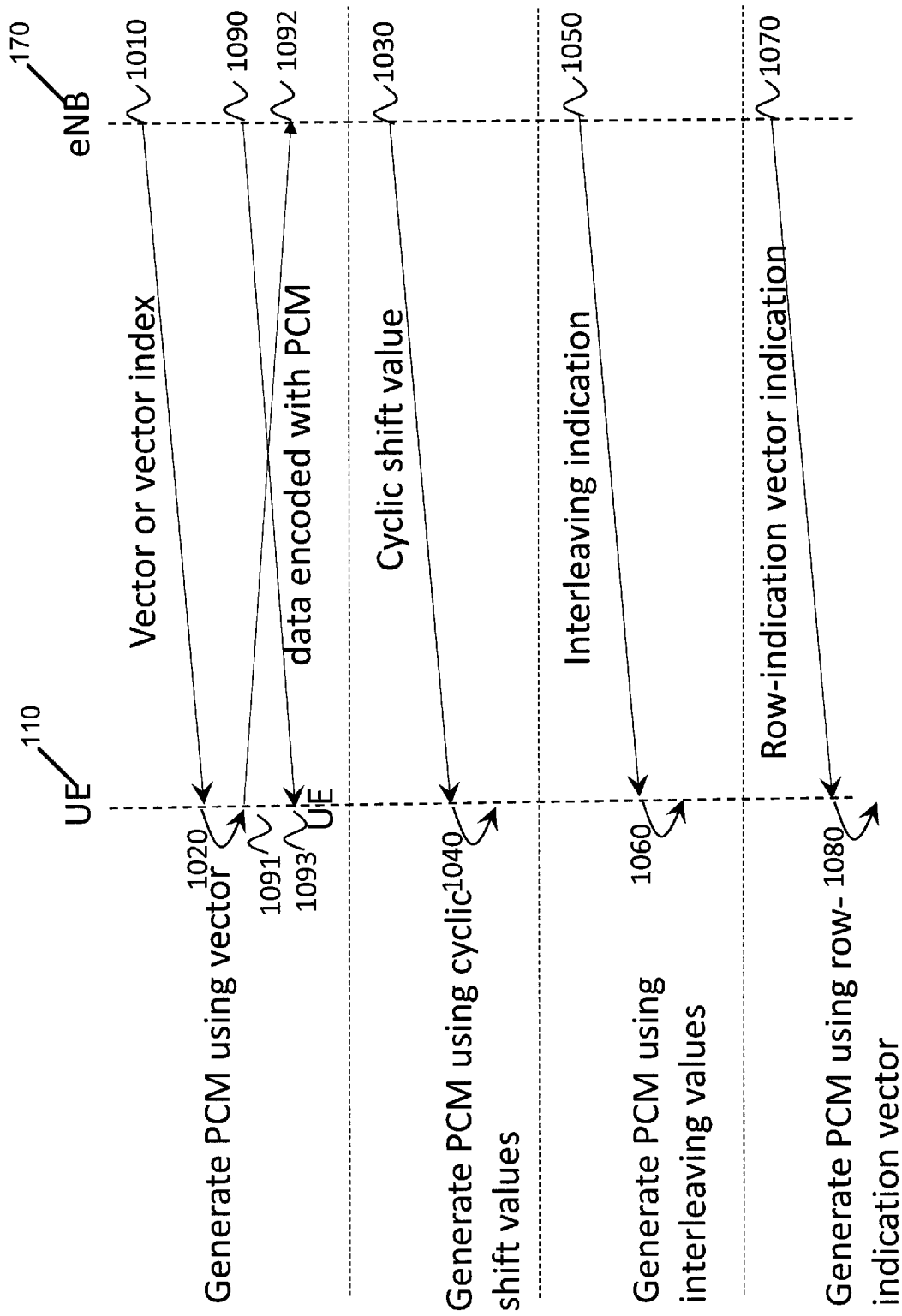
FIG. 10 illustrates a variety of signaling embodiments for signaling parameters for generating a PCM in according with embodiments of the inventions and using the generated PCM for encoding data for transmission and/or decoding received data.

FIG. 10 depicts a few possible embodiments of such parameter signaling. In one embodiment, an eNB 170 transmits (1010) substantially an entire vector to a UE 110 or an index to a vector of one or more vectors stored in the UE, which the UE receives and uses to generate (1020) sets of multiple rows of a PCM. The UE may subsequently use the generated PCM to transmit (1091) encoded data and/or to decode (1093) encoded data received from the eNB. Correspondingly, the eNB may use the vector to generate the same PCM to transmit (1090) encoded data and/or to decode (1092) encoded data received from the eNB.

In another embodiment, the eNB may in addition or instead of 1010 and 1020 transmit (1030) a cyclic shift value for generating (1040) at the UE at least one set of multiple rows of the PCM.

In another embodiment, the eNB may in addition or instead of 1010, 1020 and/or 1030, 1040 transmit (1050) an interleaving indication for generating (1060) at the UE the sets of multiple rows of the PCM, wherein the interleaving indication is indicative of an interleaving vector of at least one set of multiple rows of the PCM. The interleaving indication may for example take the form of an index into a set of possible interleaving vectors or take the form of an interleaving vector.

In another embodiment, the eNB may in addition or instead of 1010, 1020 and/or 1030, 1040 and/or 1050, 1060 transmit (1070) an row-indication vector indication for generating (1080) at the UE the sets of multiple rows, wherein the row-indication vector indication is indicative of at least one row-indication vector of at least one set of multiple rows of the PCM. The row-indication vector indication may for example take the form of an index into a set of row-indication vectors, or take the form of a row-indication vector.

As such, a UE may for example receive a vector index, a cyclic shift value for one set of multiple rows, an index of interleaving vector for another set of multiple rows and an index of a row-indication vector for each of the one and another set of multiple rows and generate the sets of rows of the PCM in accordance with the received indexes and the cyclic shift value before using the generated PCM for transmitting (1091) or decoding data (1093).

When the base matrix is generated by one of the techniques described above, or by any method derivative therefrom, at least such that such that it comprises a plurality of, typically non-identical, row-orthogonal parts, each having a column-wise combination that may be derived from a same row for the parts by, for each part, at most replacement of less than all of the same row values by values indicative of an all-zero matrix (typically denoted as −1) and expansion of the vector with zero or more elements consisting of values indicative only of the all-zero matrix and one of cyclic shifting or interleaving of the resultant vector, then layered decoding can be shared by multiple layers generated by the same row (as one example of a technical effect). In detail, when two layers are generated by a same row or at least have a column-wise combination corresponding to the same row, then one set of cyclic shift processor and layer decoder can be used for any of the two layers. We only need to set the exact cyclic shift value, such that the layer can be decoded. So the set of cyclic shift processor and layer decoder can be shared by the layers generated by the same row. The same applies if interleaving rather than cyclic shifting is applied. Only one switching network is needed and shared for all layers corresponding to the same row, so the chip area (as an example) can be reduced.

Also, based on the techniques presented above, the effort of base matrix design and the standard effort will be reduced.

Furthermore, as described above, there is also an improvement in data storage. For instance, it is possible to store only the original vector and thereby save on data storage. Conventional storage is the straightforward storage of the parts (see parts 1 and 2 of the figures) in the base matrix. Basically, the possible number of cyclic shifts of the identity matrix is Z, so one needs ceil $(\log_2(Z+1))$ bits (where "ceil" is a well-known ceiling function) to store each element of the base matrix, since one needs one additional value to indicate −1. If Z=8, one hence needs 4 bits per entry of the base matrix. For two parts each of size 4×12, one would end up storing 384 bits. By comparison, the disclosed methods might require 92 or 158 bits, depending on whether cyclic shifting is used or the more flexible interleaving approach is used. These numbers are merely illustrative, but do indicate a storage savings. Thus, generating a base matrix on the bases of a stored original vector rather than storing the base matrix itself allows for significant storage space saving.

Additional Information

The above description uses the terms "user equipment" and "base station" (or eNB). These terms are used solely for ease of description. The user equipment may be any wireless mobile device and the base station may be any wireless network access node allowing the wireless mobile device to access a wireless network. For instance, the terminology used in local area networks (LANs) (such as WI-FI, a technology that allows electronic devices to connect to a wireless LAN) is typically that a base station is referred to as an access point and the wireless mobile devices have many different names.

One skilled in the art will understand that while the examples depicted in this disclosure use very small sets of multiple rows to facilitate easily understood drawings, sets of multiple rows of a base matrix in accordance with embodiments of the invention in practical systems will reflect a substantial portion, while not necessarily all, of the base matrix.

Additional examples are as follows.

Example 1

A method, comprising: applying a base matrix to an LDPC coder, wherein the base matrix is comprised of multiple parts, each part comprising a plurality of rows and columns and the base matrix comprised of integers, wherein each integer is representative of an identity matrix cyclically shifted in accordance with the integer or representative of an all-zero matrix, wherein at least two of the multiple parts are configured such that their respective column-wise combinations of rows represents a same starting vector, cyclically shifted or interleaved, with zero or more but not all integers not indicative of the all-zero matrix of the same vector substituted by integers indicative of the all-zero matrix, wherein the at least two of the multiple parts are not identical; and using the applied base matrix, one of encoding data using the LDPC coder or decoding data using the LDPC coder.

Example 2

The method of example 1, wherein one or more of the at least two of the multiple parts are configured with one or more additional columns than the elements of same starting vector, the additional columns indicative only of the all-zero matrix.

Example 3

The method of any one of examples 1 or 2, wherein when decoding data using the LDPC coder, applying the base matrix to the LDPC coder further comprises: configuring a single layer coder with a switching fabric in accordance with the same starting vector to decode the at least two of the multiple parts.

Example 4

The method of example 3, wherein: the at least two of the multiple parts are configured such that their respective column-wise combinations of rows represents a same starting vector with one or more but not all integers not indicative of the all-zero matrix of the same vector substituted by integers indicative of the all-zero matrix; and configuring the single layer coder for decoding each of the at least two of the multiple parts further comprises respectively disabling one or more but not all portions of the switching fabric in accordance with the one or more but not all integers not indicative of the all-zero matrix of the same vector substituted by integers indicative of the all-zero matrix.

Example 5

The method of example 3, wherein the decoding data further comprises applying the data cyclically shifted to the switching fabric in accordance with a cyclic shifted representation created by shifting columns of each of one or more of the at least two parts, or the decoding data further comprises applying the data interleaved to the switching fabric in accordance with an interleaved representation created by interleaving columns of each of one or more of the at least two parts.

Example 6

The method of any one of examples 1 to 5, wherein cyclically shifted or interleaved for a part comprises cyclically shifted in a same order for all rows in the part or interleaved in a same pattern for all rows in the part.

Example 7

The method of any one of examples 1 to 6, wherein the respective number of rows of the at last two of the multiple parts are different.

Example 8

The method of any one of examples 1 to 7, wherein a respective number of cyclic shifts of the at last two of the multiple parts is different, or a respective interleaving of the at last two of the multiple parts is different.

Example 9

The method of any one of examples 1 to 8, further comprising generating the at last two of the multiple parts at least by performing the following: copying the same starting vector to each row of the at last two of the multiple parts; and substituting per each row at least one but not all of integers not indicative of the all-zero matrix by integers indicative of the all-zero matrix, such that at most one integer not indicative of the all-zero matrix remains per column in each of the multiple parts.

Example 10

The method of any one of examples 1 to 8, further comprising generating the at last two of the multiple parts at least by performing the following: for each of the at least two multiple parts, distributing the same starting vector over each row of the part, and substituting per each row zero or more but not all of integers not indicative of the all-zero matrix by integers indicative of the all-zero matrix, where at least one of dividing and substituting is performed such that at most one integer not indicative of the all-zero matrix remains per column in each of the multiple parts.

Example 11

The method of any one of examples 1 to 10, further comprising: receiving, at a user equipment from at network element, at least one received indication comprising at least one of: an indication of cyclic shift for at least one of the at least two of the multiple parts, an indication of interleaving for at least one of the at least two of the multiple parts, an indication of a row-indication vector for at least one of the multiple parts, wherein the row-indication comprising a row-indication for each element of the same vector, an indication of the same vector; and generating the at last two of the multiple parts in accordance with the at least one received indication.

Example 12

An apparatus, comprising: means for applying a base matrix to an LDPC coder, wherein the base matrix is comprised of multiple parts, each part comprising a plurality of rows and columns and the base matrix comprised of integers, wherein each integer is representative of an identity matrix cyclically shifted in accordance with the integer or representative of an all-zero matrix, wherein at least two of the multiple parts are configured such that their respective column-wise combinations of rows represents a same starting vector, cyclically shifted or interleaved, with zero or more but not all integers not indicative of the all-zero matrix of the same vector substituted by integers indicative of the all-zero matrix, wherein the at least two of the multiple parts are not identical; and means for using the applied base matrix, one of encoding data using the LDPC coder or decoding data using the LDPC coder.

Example 13

The apparatus of example 12, wherein one or more of the at least two of the multiple parts are configured with one or more additional columns than the elements of same starting vector, the additional columns indicative only of the all-zero matrix.

Example 14

The apparatus of any one of examples 12 or 13, wherein when decoding data using the LDPC coder, the means for applying the base matrix to the LDPC coder further comprises: means for configuring a single layer coder with a switching fabric in accordance with the same starting vector to decode the at least two of the multiple parts.

Example 15

The apparatus of example 14, wherein: the at least two of the multiple parts are configured such that their respective column-wise combinations of rows represents a same starting vector with one or more but not all integers not indicative of the all-zero matrix of the same vector substituted by integers indicative of the all-zero matrix; and the means for configuring the single layer coder for decoding each of the at least two of the multiple parts further comprises means for respectively disabling one or more but not all portions of the switching fabric in accordance with the one or more but not all integers not indicative of the all-zero matrix of the same vector substituted by integers indicative of the all-zero matrix.

Example 16

The apparatus of example 13, wherein the means for decoding data further comprises means for applying the data cyclically shifted to the switching fabric in accordance with a cyclic shifted representation created by shifting columns of each of one or more of the at least two parts, or the means for decoding data further comprises means for applying the data interleaved to the switching fabric in accordance with an interleaved representation created by interleaving columns of each of one or more of the at least two parts.

Example 17

The apparatus of any one of examples 12 to 16, wherein cyclically shifted or interleaved for a part comprises cyclically shifted in a same order for all rows in the part or interleaved in a same pattern for all rows in the part.

Example 18

The apparatus of any one of examples 12 to 17, wherein the respective number of rows of the at last two of the multiple parts are different.

Example 19

The apparatus of any one of examples 12 to 18, wherein a respective number of cyclic shifts of the at last two of the multiple parts is different, or a respective interleaving of the at last two of the multiple parts is different.

Example 20

The apparatus of any one of examples 12 to 19, further comprising means for generating the at last two of the multiple parts at least by using the following: means for copying the same starting vector to each row of the at last two of the multiple parts; and means for substituting per each row at least one but not all of integers not indicative of the all-zero matrix by integers indicative of the all-zero matrix, such that at most one integer not indicative of the all-zero matrix remains per column in each of the multiple parts.

Example 21

The apparatus of any one of examples 12 to 19, further comprising means for generating the at last two of the multiple parts at least by using the following: means, for each of the at least two multiple parts, for distributing the same starting vector over each row of the part, and means for substituting per each row zero or more but not all of integers not indicative of the all-zero matrix by integers indicative of the all-zero matrix, where at least one of dividing and substituting is performed such that at most one integer not indicative of the all-zero matrix remains per column in each of the multiple parts.

Example 22

The apparatus of any one of examples 12 to 21, further comprising: means for receiving, at a user equipment from at network element, at least one received indication comprising at least one of: an indication of cyclic shift for at least one of the at least two of the multiple parts, an indication of interleaving for at least one of the at least two of the multiple parts, an indication of a row-indication vector for at least one of the multiple parts, wherein the row-indication comprising a row-indication for each element of the same vector, an indication of the same vector; and means for generating the at last two of the multiple parts in accordance with the at least one received indication.

Example 23

A user equipment comprising an apparatus according to any one of examples 12 to 22.

Example 24

A base station comprising an apparatus according to any one of examples 12 to 21.

Example 25

A communication system comprising a first apparatus in accordance with any one of the examples 12 to 22 and a second apparatus in accordance with any one of the examples 12 to 21.

Example 26

A computer program comprising program code for executing the method according to any of examples 1 to 11.

Example 27

The computer program according to example 26, wherein the computer program is a computer program product comprising a computer-readable medium bearing computer program code embodied therein for use with a computer.

Example 28

An apparatus, comprising: one or more processors; and one or more memories including computer program code, the one or more memories and the computer program code configured, with the one or more processors, to cause the apparatus to perform at least the following: applying a base matrix to an LDPC coder, wherein the base matrix is comprised of multiple parts, each part comprising a plurality of rows and columns and the base matrix comprised of integers, wherein each integer is representative of an identity matrix cyclically shifted in accordance with the integer or representative of an all-zero matrix, wherein at least two of the multiple parts are configured such that their respective column-wise combinations of rows represents a same starting vector, cyclically shifted or interleaved, with zero or more but not all integers not indicative of the all-zero matrix of the same vector substituted by integers indicative of the all-zero matrix, wherein the at least two of the multiple parts are not identical; and using the applied base matrix, one of encoding data using the LDPC coder or decoding data using the LDPC coder.

Example 29

The apparatus of example 28, wherein the one or more memories and the computer program code are configured, with the one or more processors, to cause the apparatus to perform the method of any one of examples 2 to 11.

Embodiments herein may be implemented in software (executed by one or more processors), hardware (e.g., an application specific integrated circuit), or a combination of software and hardware. In an example embodiment, the software (e.g., application logic, an instruction set) is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted, e.g., in FIG. 1. A computer-readable medium may comprise a computer-readable storage medium (e.g., memories 125, 155, 171 or other device) that may be any media or means that can contain, store, and/or transport the instructions for use by or in connection with an instruction execution system, apparatus, or device, such as a computer. A computer-readable storage medium does not comprise propagating signals.

If desired, the different functions discussed herein may be performed in a different order and/or concurrently with each other. Furthermore, if desired, one or more of the above-described functions may be optional or may be combined.

Although various aspects are set out above, other aspects comprise other combinations of features from the described embodiments, and not solely the combinations described above.

It is also noted herein that while the above describes example embodiments of the invention, these descriptions should not be viewed in a limiting sense. Rather, there are several variations and modifications which may be made without departing from the scope of the present invention.

The following abbreviations that may be found in the specification and/or the drawing figures are defined as follows:

3GPP third generation partnership project
5G fifth generation
CC chase combined
DL downlink (e.g., from base station to UE)
eMBB enhanced mobile broadband
eNB (or eNodeB) evolved Node B (e.g., an LTE base station)
Gbps gigabits per second
HARQ hybrid automatic repeat request
HARQ IR hybrid automatic repeat request incremental redundancy
I/F interface
IR incremental redundancy
LDPC low density parity check
QC-LDPC quasi-cyclic LDPC
LTE long term evolution
MME mobility management entity
NCE network control element
NR new radio
N/W network
PCM parity check matrix
PEG progressive-edge-growth
QC-LDPC quasi-cyclic LDPC
RANI radio layer (e.g., working group), responsible for the specification of the physical layer of the radio interface
RRH remote radio head
Rx receiver or reception
SGW serving gateway
Tx transmitter or transmission
UE user equipment (e.g., a wireless, typically mobile device)
UL uplink (from UE to base station)

What is claimed is:

1. A method, comprising:
applying a base matrix to a low density parity check coder, wherein the base matrix is comprised of multiple parts, each part comprising a plurality of rows and columns and the base matrix comprised of integers, wherein each integer is representative of an identity matrix cyclically shifted in accordance with the integer or representative of an all-zero matrix, wherein at least two of the multiple parts are configured such that their respective column-wise combinations of rows represents a same starting vector, cyclically shifted or interleaved, with zero or more but not all integers not indicative of the all-zero matrix of the same starting vector substituted by integers indicative of the all-zero matrix, wherein the at least two of the multiple parts are not identical; and
using the applied base matrix, for one of:
encoding data using the low density parity check coder and transmitting the encoded data over a wireless communication network, or
receiving the encoded data over the wireless communication network and decoding the encoded data using the low density parity check coder.

2. The method of claim 1, wherein one or more of the at least two of the multiple parts are configured with one or more additional columns than the elements of same starting vector, the additional columns indicative only of the all-zero matrix.

3. The method of claim 1, wherein when decoding data using the low density parity check coder, applying the base matrix to the low density parity check coder further comprises:
configuring a single layer coder with a switching fabric in accordance with the same starting vector to decode the at least two of the multiple parts.

4. The method of claim 3, wherein:
the at least two of the multiple parts are configured such that their respective column-wise combinations of rows represents a same starting vector with one or more but not all integers not indicative of the all-zero matrix of the same starting vector substituted by integers indicative of the all-zero matrix; and
configuring the single layer coder to decode each of the at least two of the multiple parts further comprises respectively disabling one or more but not all portions of the switching fabric in accordance with the one or more but not all integers not indicative of the all-zero matrix of the same starting vector substituted by integers indicative of the all-zero matrix.

5. The method of claim 3, wherein the decoding data further comprises applying the data cyclically shifted to the switching fabric in accordance with a cyclic shifted representation created by shifting columns of each of one or more of the at least two parts, or the decoding data further comprises applying the data interleaved to the switching fabric in accordance with an interleaved representation created by interleaving columns of each of one or more of the at least two parts.

6. The method of claim 1, wherein cyclically shifted or interleaved for a part comprises cyclically shifted in a same order for all rows in the part or interleaved in a same pattern for all rows in the part.

7. The method of claim 1, wherein a respective number of cyclic shifts of the at least two of the multiple parts is different, or a respective interleaving of the at least two of the multiple parts is different.

8. The method of claim 1, further comprising generating the at least two of the multiple parts at least by performing the following:
copying the same starting vector to each row of the at least two of the multiple parts; and
substituting per each row at least one but not all of integers not indicative of the all-zero matrix by integers indicative of the all-zero matrix, such that at most one integer not indicative of the all-zero matrix remains per column in each of the multiple parts.

9. The method of claim 1, further comprising generating the at least two of the multiple parts at least by performing the following:
for each of the at least two multiple parts, distributing the same starting vector over each row of the part, and
substituting per each row zero or more but not all of integers not indicative of the all-zero matrix by integers indicative of the all-zero matrix, where at least one of distributing or substituting is performed such that at most one integer not indicative of the all-zero matrix remains per column in each of the multiple parts.

10. An apparatus, comprising: a processor and a non-transitory memory including computer program code, wherein the memory and computer program code are configured to, with the processor, cause the apparatus at least to:
apply a base matrix to a low density parity check coder, wherein the base matrix is comprised of multiple parts, each part comprising a plurality of rows and columns and the base matrix comprised of integers, wherein each integer is representative of an identity matrix cyclically shifted in accordance with the integer or representative of an all-zero matrix, wherein at least two of the multiple parts are configured such that their respective column-wise combinations of rows represents a same starting vector, cyclically shifted or interleaved, with zero or more but not all integers not indicative of the all-zero matrix of the same starting vector substituted by integers indicative of the all-zero matrix, wherein the at least two of the multiple parts are not identical; and
use the applied base matrix for one of:
encoding data using the low density parity check coder and transmitting the encoded data over a wireless communication network, or
receiving the encoded data over the wireless communication network and decoding the encoded data using the low density parity check coder.

11. The apparatus of claim 10, wherein one or more of the at least two of the multiple parts are configured with one or more additional columns than the elements of same starting vector, the additional columns indicative only of the all-zero matrix.

12. The apparatus of claim 10, wherein when decoding data using the low density parity check coder, applying the base matrix to the low density parity check coder further comprises:
configuring a single layer coder with a switching fabric in accordance with the same starting vector to decode the at least two of the multiple parts.

13. The apparatus of claim 12, wherein:
the at least two of the multiple parts are configured such that their respective column-wise combinations of rows represents a same starting vector with one or more but not all integers not indicative of the all-zero matrix of the same starting vector substituted by integers indicative of the all-zero matrix; and wherein configuring the single layer coder to decode each of the at least two of the multiple parts further comprises respectively disabling one or more but not all portions of the switching fabric in accordance with the one or more but not all integers not indicative of the all-zero matrix of the same starting vector substituted by integers indicative of the all-zero matrix.

14. The apparatus of claim 12, wherein decoding data further comprises applying the data cyclically shifted to the switching fabric in accordance with a cyclic shifted representation created by shifting columns of each of one or more of the at least two parts, or applying the data interleaved to the switching fabric in accordance with an interleaved representation created by interleaving columns of each of one or more of the at least two parts.

15. The apparatus of claim 10, wherein cyclically shifted or interleaved for a part comprises cyclically shifted in a same order for all rows in the part or interleaved in a same pattern for all rows in the part.

16. The apparatus of claim 10, wherein a respective number of cyclic shifts of the at least two of the multiple parts is different, or a respective interleaving of the at least two of the multiple parts is different.

17. The apparatus of claim 10, the memory and computer program code are further configured to, with the processor, cause the apparatus to generate the at last two of the multiple parts at least by performing the following:
copying the same starting vector to each row of the at last two of the multiple parts; and
substituting per each row at least one but not all of integers not indicative of the all-zero matrix by integers indicative of the all-zero matrix, such that at most one integer not indicative of the all-zero matrix remains per column in each of the multiple parts.

18. The apparatus of claim 10, the memory and computer program code are further configured to, with the processor, cause the apparatus to generate the at least two of the multiple parts at least by performing the following:
for each of the at least two multiple parts, distributing the same starting vector over each row of the part, and
substituting per each row zero or more but not all of integers not indicative of the all-zero matrix by integers indicative of the all-zero matrix, where at least one of distributing or substituting is performed such that at most one integer not indicative of the all-zero matrix remains per column in each of the multiple parts.

19. The apparatus of claim 10, wherein the memory and computer program code are further configured to, with the processor, cause the apparatus to:
receive, at a user equipment from at network element, at least one received indication comprising at least one of: an indication of cyclic shift for at least one of the at least two of the multiple parts, an indication of interleaving for at least one of the at least two of the multiple parts, an indication of a row-indication vector for at least one of the multiple parts, wherein the row-indication vector comprising a row-indication for each element of the same starting vector, or an indication of the same starting vector; and
generate the at least two of the multiple parts in accordance with the at least one received indication.

* * * * *